United States Patent [19]

Luttmer

[11] 3,835,531

[45] Sept. 17, 1974

[54] METHODS OF FORMING CIRCUIT INTERCONNECTIONS

[75] Inventor: Willem Luttmer, Romiley, England

[73] Assignee: International Computers Limited, London, England

[22] Filed: June 8, 1972

[21] Appl. No.: 263,347

[30] Foreign Application Priority Data

June 10, 1971 Great Britain .................. 27362/71

[52] U.S. Cl. .................. 29/625, 29/471.1, 29/471.7, 29/471.9, 29/472.1, 29/472.3, 174/68.5, 317/101 B

[51] Int. Cl. .............................................. H05k 3/36

[58] Field of Search ...... 156/250, 252; 29/624, 627, 29/471.1, 471.7, 471.9, 472.1, 472.3, 472.5; 174/68.5; 317/101.3

[56] References Cited

UNITED STATES PATENTS

| | | | |
|---|---|---|---|
| 3,070,650 | 12/1962 | Stearns | 29/628 UX |
| 3,486,223 | 12/1969 | Butera | 29/471.1 X |
| 3,509,270 | 4/1970 | Dube et al. | 29/625 X |
| 3,646,670 | 3/1972 | Maeda et al. | 29/627 |

*Primary Examiner*—Charles W. Lanham
*Assistant Examiner*—Joseph A. Walkowski
*Attorney, Agent, or Firm*—Misegades, Douglas & Levy

[57] ABSTRACT

A method of forming circuit interconnections between adjacent circuits of a multilayer circuit structure is described in which corresponding sets of solder protrusions carried on conductive tracks of adjacent circuits are separated by a layer of uncured, heat-curable insulating material having a transient state, in which the material becomes deformable, between the uncured and the cured states. The layer is heated and the circuits are urged towards one another during the transient, deformable state of the material so that the protrusions pierce the layer, corresponding protrusions contacting one another and the heat subsequently causing the material to become cured. Finally, the contacting protrusions are fused together.

6 Claims, 2 Drawing Figures

METHODS OF FORMING CIRCUIT INTERCONNECTIONS

BACKGROUND OF THE INVENTION

The present invention relates to methods of forming circuit interconnections between adjacent circuits of a multilayer circuit structure.

It has previously been proposed to provide circuit interconnections between circuits in a multilayer circuit structure by drilling holes through the structure at positions where tracks situated at different levels in the structure require to be joined. The walls of these holes are subsequently metallized to provide the electrical interconnections.

Since hole drilling operations involve both expensive equipment and difficult problems of accurately registering a drill bit with respect to an insulating layer, certain interconnection techniques which avoid drilling have been suggested. For example, U.K. Patent Specification 1,221,968 discloses a technique in which a forming sheet having conical members thereon is coated with a film of conductive material. A layer of dielectric material which is pre-punched in accordance with the pattern of conical risers is positioned over the risers. A conductive foil is punched so as to have raised truncated flared portions which may be positioned over the conical risers. The members are joined together upon the application of heat and pressure. If desired, the riser may be coated with a solderable material, which upon heating will form a soldered connection between the riser and the punched truncated flared portions.

While the above technique avoids the problems associated with mechanically drilling insulating layers, three members must be pre-punched prior to the operations of forming an interconnection. Also, the interconnections are still large in cross-sectional areas as the base of each riser has a diameter of approximately 0.030 in. while the risers must be spaced on centres 0.050 in. apart. Thus, only relatively low track densities are obtainable from the technique of the cited specification.

SUMMARY OF THE INVENTION

A method of forming circuit interconnections between adjacent circuits of a multilayer circuit structure consists of the steps of forming a pattern of conductive protrusions, having at least a coating of solder thereon, on a first set of conductors carried on an insulating substrate and forming an inverse pattern of similar conductive protrusions on a second set of conductors carried on a further insulating substrate; positioning a layer of uncured curable insulating material between said substrates, the insulating material having a transient state between the uncured and the cured states in which the material is deformable, the substrates being arranged so that the sets of conductors face towards the insulating layer with the protrusions on the first set of conductors aligned one with each of the protrusions on the second set of conductors respectively; applying pressure to urge the substrates towards one another during a period in which the insulating layer is cured, the material passing through said transient state in this period, the pressure being sufficient to cause aligned protrusions to pierce the layer and to be brought respectively into intimate contact one with another, and the final curing of the layer being effective to convert the layer into an insulating body surrounding the protrusions and separating the patterns of conductors; and fusing said contacting protrusions to one another.

BRIEF DESCRIPTION OF THE DRAWING

A method of forming circuit interconnections embodying the present invention will now be described, by way of example, with reference to the accompanying drawing, in which.

DESCRIPTION OF THE PREFERRED EMBODIMENT

Figure 1:
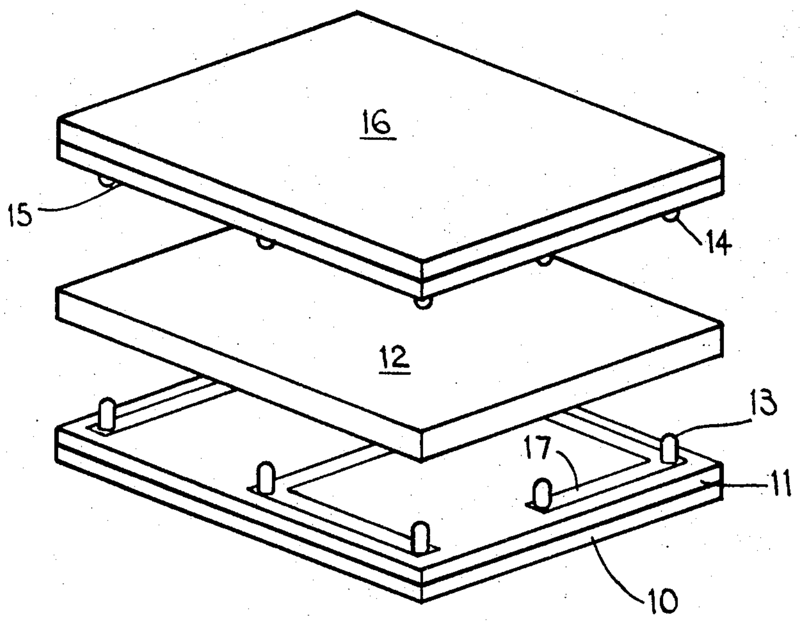
FIG. 1 shows an isometric view of various layers of material prior to forming circuit interconnections.

Referring now to FIg. 1, there is shown an earth plane 10 which is comprised of any suitable conductive material, such as copper. Earth plane 10 is bonded to an insulating substrate 11 which, for example may be an epoxy fibreglass. A pattern of electrically conductive tracks 17 is formed on substrate 11 by any conventional technique, e.g. etching, screening, etc. Upon forming tracks 17, which may be of the order of 0.005 in. wide, solder bumps 13 are positioned at the ends of tracks 17. The particular locations of solder bumps or protrusions 13 will define the points of interconnection between a track 17 on substrate 11 and a further track (not shown) on substrate 15.

A second earth plane 16, which is similar to earth plane 10 is bonded to a substrate 15, which may also be comprised of epoxy fibreglass. Solder bumps or protrusions 14 are formed on conductive tracks (not shown) on substrate 15. Solder bumps 14 form a pattern which is the inverse of the pattern of the solder bumps 13 and are positioned on conductive tracks 17. Both sets of solder bumps 13 and 14 will have cross-sectional diameters of the same order of the width of a particular track 17, say 0.005 in. An insulating layer 12 is positioned between the sets of aligned solder bumps 13 and 14. The insulating layer is formed from a heat curable resin based material having a transient state between the uncured and the cured states in which the material becomes deformable. Also the material must not have a significant glass content. An example of one such resin based material is a phenolic-butynol dry adhesive film commercially known as "Permacel".

At this point with the initial steps of the method completed the various layers are positioned as shown in FIG. 1, the corresponding pairs of solder bumps 13 and 14 being in alignment. The ground planes 10 and 16 together with their respective substrate layers and conductive tracks are urged towards one another while simultaneously heat is applied to render the insulating layer 12 deformable so that solder bumps 13 and 14 pierce the layer 12. As noted above, it is important that the layer 12 does not contain a significant amount of glass as this would prevent solder bumps 13 and 14 from piercing the layer 12. Since substrates 11 and 15 are preferably formed from an epoxy fibreglass, sufficient mechanical strength will be imparted to the final interconnection structure.

Figure 2:
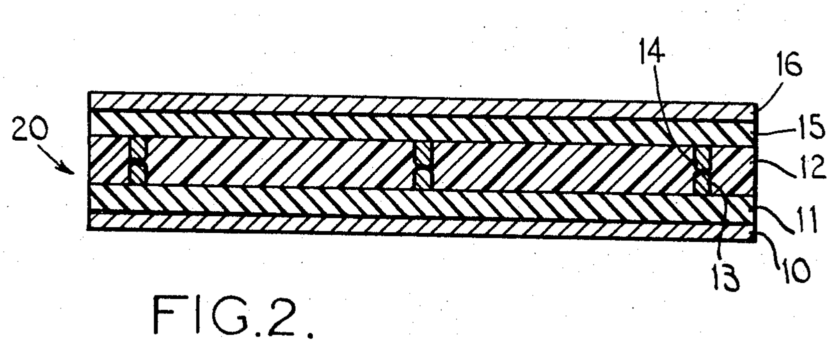
FIG. 2 shows a circuit interconnection formed in accordance with the present invention.

The heat which is applied, initially to render layer 12 deformable and subsequently to cure it, must not be sufficient to cause solder bumps 13 and 14 to soften. It has been found that at a temperature of approximately 160°C insulating layer 12 will become substantially deformable and will thereby allow corresponding pairs of solder bumps 13 and 14 to contact one another without resulting in any significant softening of the solder bumps. At this point, the applied pressure to the structure 20 as shown in FIG. 2 is sufficient to cause a more intimate contact between aligned pairs of the solder bumps 13 and 14. After the insulating layer 12 is fully cured the temperature is raised to approximately 250°C at which the solder bumps 13 and 14 will melt and form a reliable bond.

The resulting structure 20 of FIG. 2 will consist of earth planes 10 and 16 bonded to respective substrates 11 and 15, solder bumps 14 and 13 providing circuit interconnections between conductive tracks (not shown) on substrates 15 and 11 and the layer 12 provides electrical insulation around interconnections formed of corresponding ones of solder bumps 13 and 14.

It will be appreciated however, that during the bonding of solder bumps 13 and 14, an evenly distributed pressure is applied to urge the sets of solder bumps 13 and 14 towards one another. However, care must be taken to prevent flattening of solder bumps 13 and 14 under too great a pressure. The solder bumps may conveniently be produced by an electro forming process. To prevent the risk of excessive flattening during the initial application of pressure the bumps may be made substantially of copper covered with a relatively thin layer of solder. Such a pressure may be applied by any conventional means, e.g. laminating presses etc., to the exterior of earth planes 10 and 16. High density multilayer boards have a particular requirement for interconnecting high speed integrated circuits. Such interconnections require transmission line characteristics, which are achieved by providing earth planes 10 and 16. If, however, the electrical impedance of the interconnection does not enter into the design of the printed circuit board these earth planes may be omitted.

Although the insulating layer 12 has been described as being formed from a resin based material it will be appreciated that the layer may be formed from any insulating material having an uncured and a cured state with a transient state during the curing operation in which the material becomes deformable.

In summary, the present invention provides a method of forming solid circuit interconnections without the problems of mechanically drilling holes through insulating members

I claim:

1. A method for connecting first terminals of conductors on a first substrate of insulating material to corresponding second terminals of conductors on a second substrate of insulating material which comprises; forming fusible protrusions at desired positions on the first substrate to provide the first terminals; forming fusible protrusions on the second substrate to provide the second terminals at positions complementary to those of the first terminals; positioning a layer of curable insulating material in an uncured condition on said first substrate so that the layer rests on the first terminal protrusions said material having a transient state between the cured and the uncured states in which the material becomes deformable; disposing the second substrate over said layer so that the first and second terminals face towards each other and are aligned with each other with said layer therebetween; curing said layer; applying pressure to urge the first and second substrate towards each other during the transient state of the curing process to cause the aligned terminals to pierce said layer from opposed directions and contact each other and to enable said layer to fill completely the space between the substrates; effecting final curing of said layer whilst maintaining the terminals in intimate contact with each other to concert said layer into an insulating body surrounding the terminals and isolating the conductors from each other; and fusing the intimately contacting terminals to one another.

2. A method as claimed in claim 1, in which the layer is heat curable and the curing includes a first stage of raising the temperature of the layer to the first level which will cause the layer to undergo its curing process but will not cause the terminal protrusions to fuse, and a second stage in which, after the layer is fully cured, the temperature of the protrusions is raised to a level sufficient to fuse the protrusions.

3. A method as claimed in claim 2, and including the step of forming said insulating layer from a phenolic-butynol dry adhesive film.

4. A method as claimed in claim 3, in which during the first stage the temperature is raised to approximately 160°C, and during the second stage the temperature is raised to approximately 250°C.

5. A method as claimed in claim 1 in which said terminal protrusions are formed by applying solder to the substrate at each of the said desired positions.

6. A method as claimed in claim 1, in which said terminal protrusions are formed by applying a copper element to the substrate at each of the said desired positions and then coating the copper element with solder.

* * * * *